(12) United States Patent  
Yagisawa

(10) Patent No.: US 7,671,709 B2
(45) Date of Patent: Mar. 2, 2010

(54) SUBSTRATE AND SUBSTRATE MODULE

(75) Inventor: Takatoshi Yagisawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 268 days.

(21) Appl. No.: 11/277,563

(22) Filed: Mar. 27, 2006

(65) Prior Publication Data

US 2007/0126524 A1 Jun. 7, 2007

(30) Foreign Application Priority Data

Dec. 6, 2005 (JP) ............................. 2005-352699

(51) Int. Cl.
H01P 5/02 (2006.01)

(52) U.S. Cl. ..................... 333/260; 333/246; 333/33

(58) Field of Classification Search ................. 333/238, 333/246, 33, 260
See application file for complete search history.

(56) References Cited

U.S. PATENT DOCUMENTS 7,109,830 B2 * 9/2006 Sweeney et al. ............ 333/246

OTHER PUBLICATIONS

"Patent Abstracts of Japan," Japanese Patent Publication No. 2005-101026, Publication Date: Apr. 14, 2005, Inventor: Ono Katsuya et al., Abstract Only.
"Patent Abstracts of Japan," Japanese Patent Publication No. 2005-26801, Publication Date: Jan. 27, 2005, Inventor: Torigoe Makoto et al., Abstract Only.
Multi-source Agreement (MSA) of 10 Gbit/s Miniature Device (XMD) Jan. 17, 2006.

* cited by examiner

Primary Examiner—Stephen E Jones
(74) Attorney, Agent, or Firm—Staas & Halsey, LLP

(57) ABSTRACT

A substrate module includes a first substrate and a second substrate. The first substrate comprises a base material; a transmission line in which a signal line is sandwiched between two ground patterns, on the surface of the base material; a ground pattern on the rear surface of the base material; and an exposed portion in which the ground pattern on the substrate surface is exposed by partially cutting out the base material and the ground pattern on the substrate rear surface. The second substrate comprises a base material and a transmission line in which a signal line is sandwiched between two ground patterns, on the surface of the base material. In connecting a transmission line of the first substrate and that of the second substrate, the ground patterns of the first and second substrates are fused with each other at the exposed portion and fixed.

16 Claims, 8 Drawing Sheets

SUBSTRATE AND SUBSTRATE MODULE

BACKGROUND OF THE INVENTION

1. Field of the Invention

The present invention relates to a connection of high frequency transmission lines, and more specifically, to the implementation of a connection portion between transmission lines which is capable of keeping a frequency characteristic in a good condition and of which a satisfactory connection strength can be maintained by easy means, through the use of substrates.

2. Description of the Related Art

Hitherto, the high frequency transmission lines has been connected by connecting, using a golden (Au) wire or an Au ribbon, two dielectric substrates on each of which a coplanar transmission line is formed on a signal line between grounds, or the high frequency transmission lines have been packaged and connected by a coaxial line via a connector.

However, under the recent tendency of transmission signals toward high frequencies, when the high frequency transmission lines are connected by an Au wire or an Au ribbon, an impedance-mismatched part in a connection portion can give rise of deterioration of high-frequency characteristic. This requires a reduction in the length of the Au wire or Au ribbon. Furthermore, with the tendency of transmission signals toward high frequencies, deterioration of high frequency characteristic due to displacements between transmission lines in the longitudinal direction and the height direction also becomes significant.

Therefore, considering positional displacements, position tolerance, and the like between the dielectric substrates, there is a limit to the connection between the substrates by an Au wire or Au ribbon. On the other hand, the way of connecting the substrates via the connector causes a higher cost, a larger size, the need for extra-length processing spaces of coaxial line and the like, and hence, this is unsuitable for size reduction or cost reduction. With such being the situation, in recent years, a method for connecting high-frequency transmission lines by using flexible substrates in connection portion has been prevalently employed.

That is because the use of impedance-matched flexible substrates allows the problem of the connection length and positional displacements between connection portions to be solved, thereby increasing the degree of freedom of the connection portion.

Techniques for connecting substrates utilizing flexible substrates are disclosed in Japanese laid-open Patents No.2005-101026, No.2005-26801 and No.2002-503033, and US published application No.US2004/0264882 A1.

When attempting to connect a transmission line on the flexible substrate and another transmission line to secure a band on the level of 40 GHz, it is difficult to keep a high-frequency characteristic in a good condition and maintain a satisfactory connection strength, at the connection portion between the transmission lines.

For an optical module, however, it is necessary that the connection portion between the substrate, and a laser device and/or a light-receiving device secures a band on the level of 40 GHz, keeping high-frequency characteristic in a good condition, and maintaining a satisfactory connection strength.

When attempting to secure a band on the level of 40 GHz and keep a high-frequency characteristic in a good condition, a problem of impedance mismatch can arise.

This problem is attributable to positional displacements and/or position tolerance between substrates, caused by the structure and material of the transmission lines at the connection portion between a substrate and a flexible substrate used for the connection between the substrate and a light receiving/emitting element.

When the surfaces of signal lines in coplanar lines on two substrates are directed in the same direction, the inter-ground distance of each of the two substrates is treated as being equivalent to an inductor, and hence, positional displacements and/or position tolerance between the substrates causes an impedance-mismatch, thereby resulting in degradation of high frequency characteristic.

With the above-described arrangement used, there is a high probability that stress will concentrate on the connection portion between the substrates to thereby break down a flying lead portion for connection.

On the other hand, when using a connection method in which the surfaces of signal lines in the coplanar lines on the flexible substrate and the dielectric substrate are connected face to face, the difference in the inter-ground distance between the two substrates can be reduced, but the problem associated with the strength of the connection portion remains to be solved.

SUMMARY OF THE INVENTION

Accordingly, an object of the present invention is to provide substrates and a substrate module that, regarding the connection of high frequency transmission lines, can keep a high frequency characteristic in a good condition, and maintain the connection strength thereof by easy methods, using the substrates or substrate module for signal transmission.

To attain the above-described object, the present invention adopts the following constructions:

As first construction, a substrate that includes a base material, a transmission line and a ground exposed portion. the transmission line provides on a first surface of the base material and is formed by sandwiching a signal line between two grounds. the ground exposed portion configures so that the grounds provided on the first surface of the basic material are exposed on a second surface of the base material by partially cutting out the base material.

As second construction, a substrate module that includes a first substrate and a second substrate.

The first substrate comprises a base material, a first transmission line and a ground exposed portion. The first transmission line formes a first signal line and first grounds, the first signal line positiones between first grounds on the first surface of the base material. The ground exposed portion cut out the base material for exposing the first ground on the base material surface.

The second substrate comprises a dielectric substrate and a second transmission line. The dielectric substrate comprising dielectricmaterial. The second transmission line positiones on the dielectric substrate, the second transmission line comprises a second signal line positioned between second grounds.

The first signal line and the first grounds face to the second signal line and the second grounds. The ground exposed portion touches at least one of the second grounds. The first substrate connected the second substrate at the ground exposed portion.

According to the construction of an embodiment of the present invention, the base material and the rear surface grounds are partially cut out so that the ground portions of the transmission line arranged on the substrate surface are exposed, and the substrates are connected using the exposed portions. By advantage of this feature, it is possible to keep a frequency characteristic within a band on the level of 40 GHz in a good condition, and secure an enhanced connection strength.

BRIEF DESCRIPTION OF THE DRAWINGS

FIGS. 1A and 1B show a substrate for connection and a substrate on which electric circuitry is mounted, according to an embodiment of the present invention, wherein FIG. 1A is a perspective view thereof, FIG. 2 is a perspective view of a first modification of the embodiment shown in FIG. 1.

DESCRIPTION OF THE PREFERRED EMBODIMENTS

Figure 1:
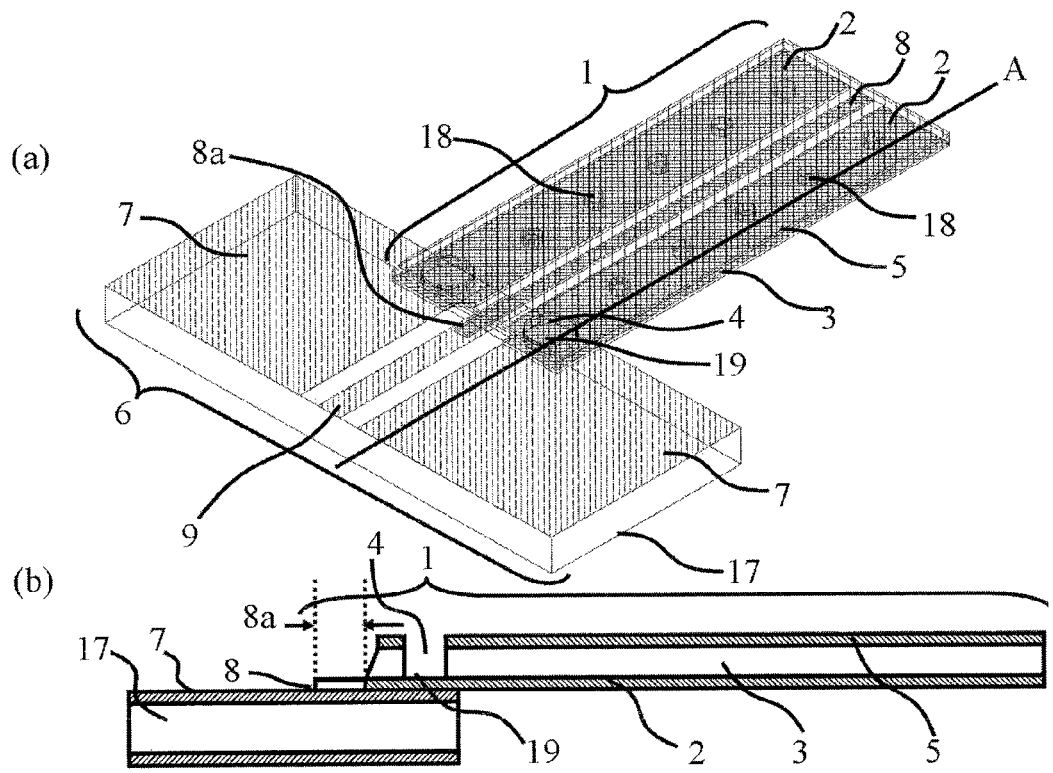

The present invention is directed to a connection substrate for connecting a substrate on which circuits such as a drive circuit for driving a laser device, and an amplifier for amplifying signals from a photo acceptance device are mounted, to a laser device and/or a photo acceptance device; and directed to a substrate module using the above-described substrate.

Hereinafter, an embodiment according to the present invention will be described with reference to accompanying drawings. Throughout the drawings, the same or functionally equivalent parts are designated with the same reference numerals.

FIGS. 1A and 1B are each a representation of the embodiment according to present invention. FIG. 1A is a perspective view of a substrate for connection and a substrate on which electric circuitry is mounted. FIG. 1B is a sectional view of these substrates cut taken away along a line A in FIG. 1A.

The substrate 1 for connecting a light receiving/emitting element between the substrate 1 and the substrate on which electric circuitry is mounted, is a flexible substrate that forms a transmission line with an impedance kept constant.

Regarding the substrate 1, its base material 3 is formed of polyimide resin of 10 to 100 μm thick. However, the material of the base material is not limited to polyimide. Besides polyimide, the materials for the base material may include polytetrafluoroethyrene (PTFE), glass epoxies, plastics, liquid crystal polymers, and so on.

On the surface (one of the surfaces) of the base material 3 constituting the substrate 1, there is provided a coplanar transmission line formed by sandwiching a signal line 8 between substrate surface grounds 2.

On the rear surface of the base material 3, i.e., on the opposite surface to the surface on which the transmission line is formed, there are provided substrate rear-surface grounds 5. The substrate rear-surface grounds 5 are arranged over the substantially entire rear surface of the base material 3.

The substrate 1 with such an arrangement has a ground exposed portions 19 that are formed by exposing the substrate surface grounds 2 formed on the surface of the base material 3 by partially cutting out the base material 3 and the substrate rear-surface grounds 5.

The ground exposed portions 19 are disposed at an end portion on the substrate, of the substrate surface grounds 2 provided on opposite sides of the signal line 8 so as to sandwich the signal line 8.

Regarding the configuration of each of the ground exposed portions 19, it may be either hole 4 having a circular cross-sectional shape as shown in FIG. 1A, or it may take a configuration so as to be cut out up to a side surface of the base material 3 (i.e., the surface orthogonal to the surface on which the transmission line is arranged). Furthermore, the direction of cutting-out may be either the direction orthogonal to the transmission line, or the same direction as it.

The shape and size of the ground exposed portions 19 must be a shape and size such as to cause no impedance mismatch between the ground exposed portions 19 and a dielectric substrate 6 on which electric circuitry is mounted, the dielectric substrate 6 being connected to the ground exposed portions 19.

Also, the size of the ground exposed portions 19 must be a size large enough to accommodate a tool for connecting two substrates, or a size large enough to allow laser beams for thermal fusion to enter the ground exposed portions 19.

At the end portion of the substrate 1, where the signal line 8 on the substrate 1 is connected to a dielectric substrate signal line 9 on the dielectric substrate 6, the signal line 8 protrudes from the substrate rear-surface grounds 5 and the base material 3, thereby forming a signal line flying lead portion 8a.

The signal line flying lead portion 8a may either be in a state in which the signal line 8 protrudes as it is, or take a shape of a modification to be described later.

The substrate surface grounds 2 of the substrate 1 and the substrate rear-surface grounds 5 are electrically connected by a plurality of via holes 18. These via holes are arranged along the signal line 8 as shown in FIG. 1A.

Although the substrate 1 has via holes as described above, a line close to a pure coplanar line or a microstrip line would require no via hole.

The ground exposed portions 19 and signal line flying lead portions 8a and 8b (8b is described later) can be formed by a process used in ordinary practice.

The surface of the substrate 1 with the above-described arrangement is configured to have thereon nothing other than the signal line 8 and the substrate surface grounds 2 to maintain the impedances of the transmission line at a predetermined value. However, in order to protect the substrate surface, a resist layer to be applied onto the substrate surface is accepted as an exception. That is, anything that causes neither position tolerance nor level difference at the connection portion between the substrate 1 and the dielectric substrate 6 so as to exert no virtual influence on the impedance, as in the case of this resist layer, may be provided on the substrate surface.

The substrate on which electric circuitry is mounted comprises the dielectric substrate 6 of which the base material is formed of a dielectric. The dielectric substrate 6 has a transmission line on a dielectric substrate base material 17.

The base material 17 of the dielectric substrate 6 is formed of alumina ceramic. However, the base material 17 is not limited to the alumina ceramic.

The dielectric substrate 6 has a coplanar transmission line formed by sandwiching the dielectric substrate signal line 9 between the dielectric substrate surface grounds 7.

The signal line 8 and the substrate surface grounds 2 on the substrate 1 are opposed to the dielectric substrate signal line 9 and the dielectric substrate surface grounds 7 on the dielectric substrate 6, respectively, and further, the end portions of the substrate 1 and the dielectric substrate 6 are superimposed so that the ground exposed portions 19 contact the second grounds, on the dielectric substrate surface grounds 7.

After this superimposition, the substrate surface grounds 2 are fixed to the dielectric substrate surface grounds 7.

As a specific fixing method, the metals of the substrate surface grounds 2 and the dielectric substrate surface grounds 7 are heated at the ground exposed portions 19 from the substrate rear-surface by laser beams such as YAG laser beams, so that they are fused with each other and the substrate surface grounds 2 are fixed to the dielectric substrate surface grounds 7.

As an alternative fixing method, the substrate surface grounds 2 can be fixed to the dielectric substrate surface grounds 7 by a fixing material.

Specifically, between the substrate surface grounds 2 and the dielectric substrate surface grounds 7 in the ground exposed portions 19, there is provided a fixing material for physically fixing the substrate surface grounds 2 and the dielectric substrate surface grounds 7.

The fixing material for the substrate surface grounds 2 and/or the dielectric substrate surface grounds 7 is gold (Au), tin (Sn), or aluminum (Al). These substrate surface grounds 2 and/or dielectric substrate surface grounds 7 are plated in advance with such a fixing material.

After this plating process, pressure and or heat are applied to the ground exposed portions 19 from the substrate rear surface side using a tool, thereby performing thermal compression (i.e. thermocompression)bonding for fixation. Here, the heating may also be conducted by a laser beams such as YAG laser beams.

Instead of the fixing method using the plating with Au or Sn as a fixing material, another fixing method may be employed in which solder balls are provided between the substrate surface grounds 2 and the dielectric substrate surface grounds 7, and in which they are connected and fixed by thermal compression bonding using a tool.

After the fixing process has been performed, the signal line flying lead portion 8a and the dielectric substrate signal lines 9 are fixed by solder.

By virtue of the above-described fixing method, the overall substrates 1 and 6 can be fixed by the substrate surface grounds 2 and the dielectric substrate surface grounds 7, without the signal line 8 being subjected to stress. Moreover, since the signal line 8 and the substrate surface grounds 2 on the substrate 1 are opposed to the dielectric substrate signal line 9 and the dielectric substrate surface grounds 7 on the dielectric substrate 6, respectively, and the substrate surface is configured to have thereon nothing other than the signal line 8 and the substrate surface grounds 2, it is possible to reduce an impedance-mismatch section (gap) on the transmission line formed on the substrate 1 and the dielectric substrate 6 to a gap on the level of 10 micrometers to several hundreds of micrometers.

Figure 2:
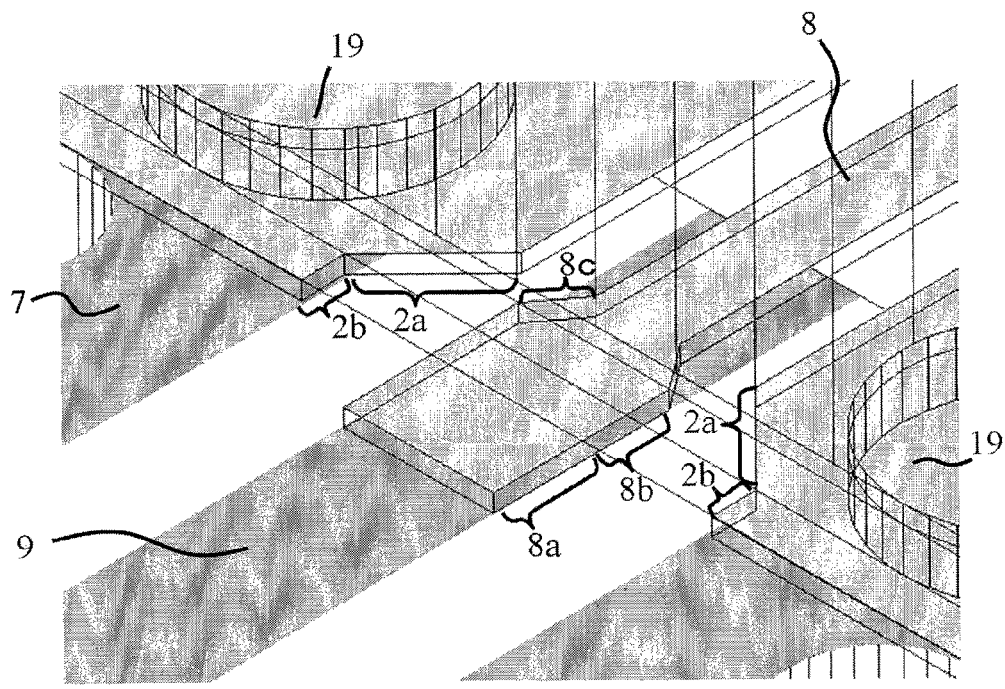
FIG. 2 is a sectional view thereof

FIG. 2 shows a first modification of the embodiment in FIG. 1. In order to provide a clear understanding of the arrangement, FIG. 2 illustrate the enlarged end portion of each of the substrate 1 and the dielectric substrate 6 in FIG. 1. In FIG. 2, the difference of this modification from the embodiment in FIG. 1 lies in the structure of an end portion of the substrate 1 to be connected to an end portion of the dielectric substrate 6.

When connecting transmission lines between two substrates that are mutually different in material and/or thickness, the following structures are required in order to keep the impedances of the transmission lines at a fixed value, because the widths of signal lines or the inter-ground gaps cannot be conformed between the two substrates.

By tapering the signal line 8 in the transmission line and/or the substrate surface grounds 2 at the end portion of the substrate 1, a steep change in electrolytic density can be relaxed when connecting transmission lines between substrates that are mutually different in the signal line width and/or the inter-ground gap, thereby allowing an improvement in high-frequency reflection characteristic.

Specifically, the signal line 8 has the same width as that of the dielectric substrate signal line 9 up to the signal line flying lead portion 8a and the region of an inner side 8b of the base material 3. At a portion 8c, the inner side 8b tapers down to the same width as that of the signal line 8 on the substrate 1. Similarly to the substrate surface grounds 2, each of the substrate surface grounds 2 has a portion 2a that tapers with the change of the width of the signal line 8, and a portion 2b having the same width as that of the edge of the dielectric substrate surface ground 7.

As described above, at the connection portion of signal lines, since the transmission line formed on the substrate 1 changes into tapered shapes and is connected to the transmission line formed on the dielectric substrate 6, the change in impedance becomes gentle, thereby allowing prevention of reflection from the connection portion.

In FIG. 2, because the structures other than the signal line 8 and the substrate surface grounds 2 at the end portion of the substrate 1 are the same as those in FIG. 1, description thereof is omitted.

Figure 3:
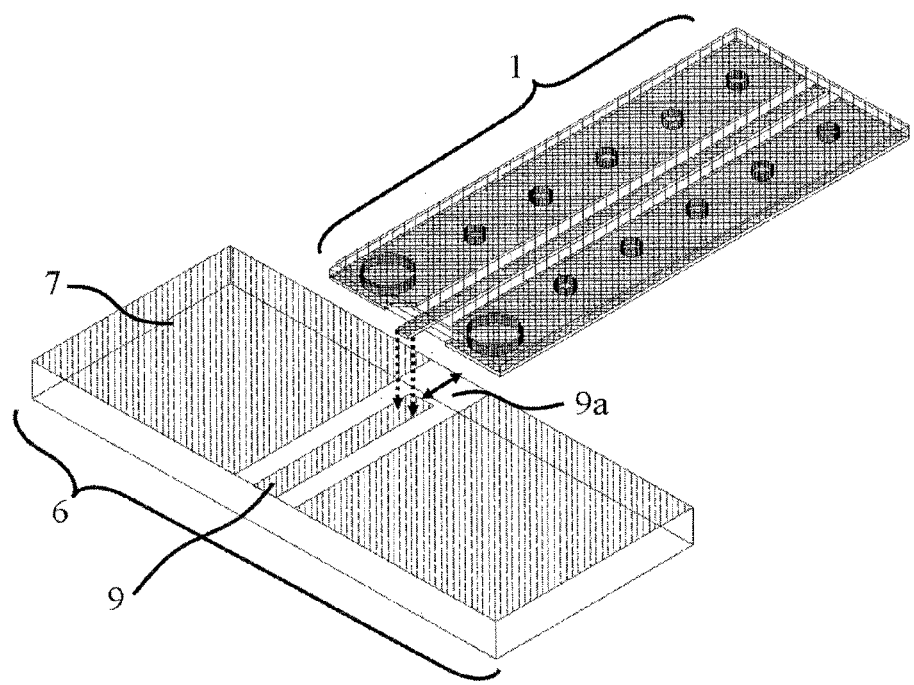
FIG. 3 is a perspective view of a second modification of the embodiment in FIG. 1.

FIG. 3 shows a second modification of the embodiment in FIG. 1. In FIG. 3, the difference of this modification from the embodiment in FIG. 1 lies in the structure of the dielectric substrate signal line 9 at the end portion of the dielectric substrate 6. Specifically, the dielectric substrate signal line 9 is configured to retreat toward the inner side of the dielectric substrate 6 by a width of 9a, at the end portion of the dielectric substrate 6.

When a relative dielectric constant of the dielectric substrate 6 is high, or the difference in size between the signal line 8 on the substrate 1 and the dielectric substrate signal line 9 is large, the retraction of the signal line 9 on the side of the dielectric substrate 6 as shown in FIG. 3, is effective in achieving impedance matching in the transmission line at the place where the substrates are connected.

In FIG. 3, because the structures other than the dielectric substrate signal line 9 are the same as those in FIG. 1, description thereof is omitted.

Figure 4:
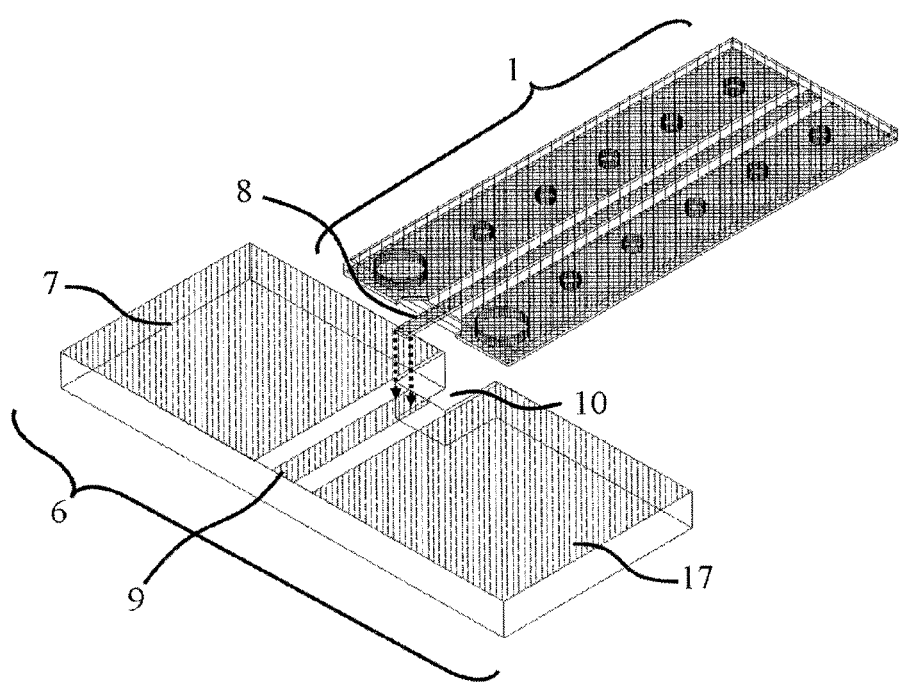
FIG. 4 is a perspective view of a further modification of the modification shown in FIG. 3.

FIG. 4 shows a further modification of the modification shown in FIG. 3. In FIG. 4, the difference of this modification from that in FIG. 3 lies in the structure of the dielectric substrate base material 17 at an end portion of the dielectric substrate 6.

FIG. 4 shows the structure of a groove 10 formed by partially cutting out the dielectric base material 17 up to a position to which the signal line 9 at the end of the dielectric substrate 6 has been retracted. FIG. 4 shows a configuration in which the groove 10 is formed by cutting out the base material 17 of the dielectric substrate 6 from the surface to the rear surface of the dielectric substrate 6, but it is not necessarily required to cut out the dielectric base material 17 up to the rear surface of the substrate. It suffices only to dig into the base material 17 to the extent that no impedance mismatch occur in the transmission line at the portion where the substrate 1 and the dielectric substrate 6 are superimposed on each other.

In general, when ceramic substrate, having a high dielectric constant, contacts the transmission line, the effective dielectric constant significantly changes, so that an impedance mismatch undesirably occurs at that contact portion. Because this contact position is influenced by dielectric constant and the length of the contact portion, the use of the structure as shown in FIG. 4 allows a reduction in the influences of the dielectric substrate on the transmission line on the substrate 1 in this case, thereby resulting in an improvement in high frequency characteristic.

In FIG. 4, because the structures other than the dielectric substrate signal line 9 and the groove 10 are the same as those in FIG. 1, description thereof is omitted.

Figure 5:
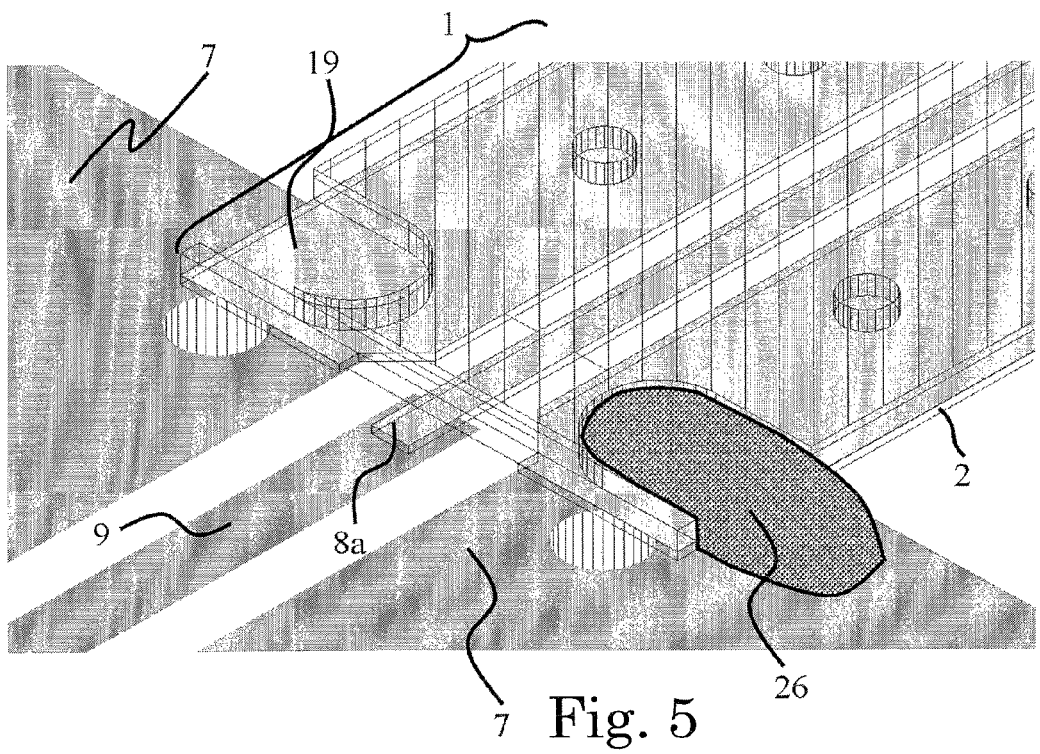
FIG. 5 is a perspective view of a third modification of the embodiment in FIG. 1.

FIG. 5 shows a third modification of the embodiment in FIG. 1. In order to provide a clear understanding of the arrangement, FIG. 5 illustrates the enlarged end portion of each of the substrate 1 and the substrate 6 in FIG. 1. In FIG. 5, the difference of this modification from the embodiment in FIG. 1 lies in that each of the ground exposed portions 19 is formed not of hole 4 but of a notch.

As shown in FIG. 5, by expanding each of the portions of the holes 4 of the substrate 1 up to the end portion of the side surface of the substrate 1, an interface between substrate surface grounds 2 and the dielectric substrate surface grounds 7 is formed at the end portion of the substrate 1.

According to FIG. 5, in the substrate 1, the upper-left corner portion of the figure represents a notched ground exposed portion 19, and the lower-right portion in the figure represents an arrangement fixed by a fixing member 26 constituted of solder or an adhesive, across the interface between the ground exposed portion and the dielectric substrate surface grounds.

As described in reference with FIG. 1, the modification in FIG. 5 may be arranged so that, after the ground exposed portions 19 has been connected to the dielectric substrate 6 using laser beams or a tool, the interface therebetween is further fixed.

In FIG. 5, because the structures other than the ground exposed portions 19 and the fixing member 26 are the same as those in FIG. 1, description thereof is omitted.

Figure 6:
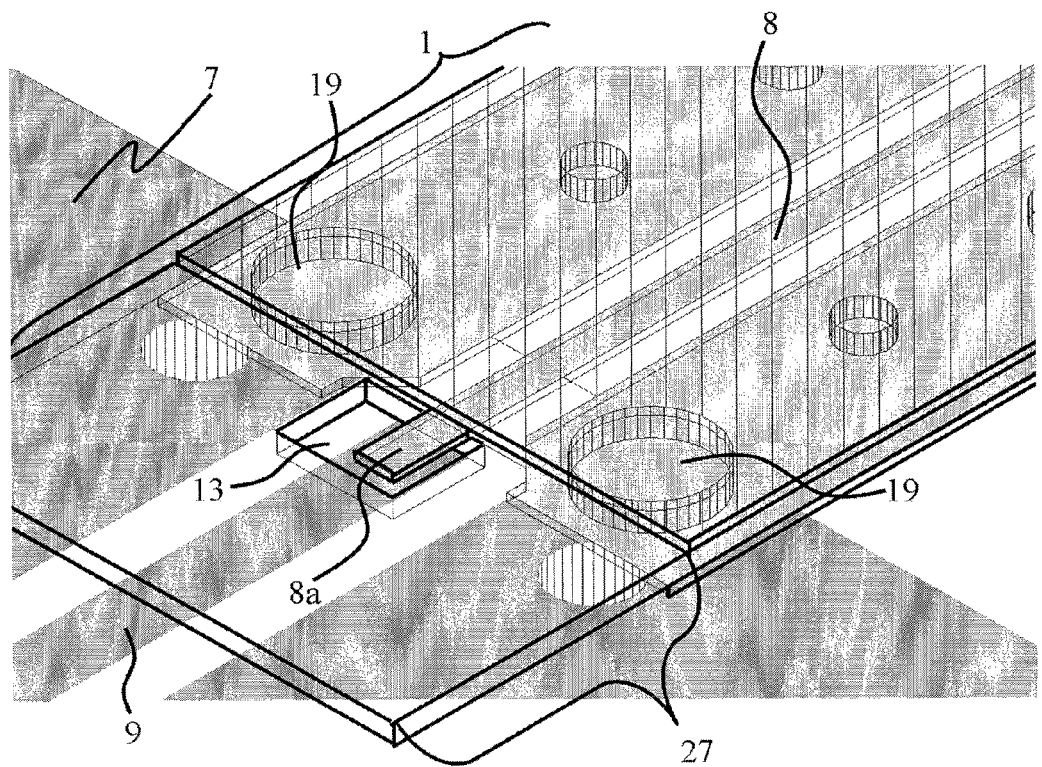
FIG. 6 is a perspective view of a fourth modification of the embodiment in FIG. 1.

FIG. 6 shows a fourth modification of the embodiment in FIG. 1. In order to provide a clear understanding of the arrangement, FIG. 6 illustrates the enlarged end portion of each of the substrate 1 and the substrate 6 in FIG. 1. In FIG. 6, the difference of this modification from the embodiment in FIG. 1 lies in the construction of the base material 3 at the end portion of the substrate 1.

The substrate 1 in FIG. 6 has an expansion portion 27 formed by expanding the base material 3 forward of the substrate surface grounds 2, the signal line 8, and the substrate rear-surface grounds 5. The expansion portion 27 has therein a base material hole 13 for forming a signal line flying lead portion 8a of the signal line 8. The base material hole 13 penetrates the base material 3. Here, the signal line 8 and the dielectric substrate signal line 9 are electrically connected using the base material hole 13.

This way of configuring the base material 3 makes it possible to fix the substrate 1 at the front end of the base material 3 by the dielectric substrate 6 and an adhesive, and to conduct work while catching hold of the expansion portion 27 in front of the substrate 1.

As shown in FIG. 6, this modification is configured so that only the base material 3 protrudes, but alternatively, the arrangement may be such that the substrate surface grounds 2 protrudes together with the base material 3. In FIG. 6, because the structures other than the expansion portion 27 are the same as those in FIG. 1, description thereof is omitted.

Figure 7:
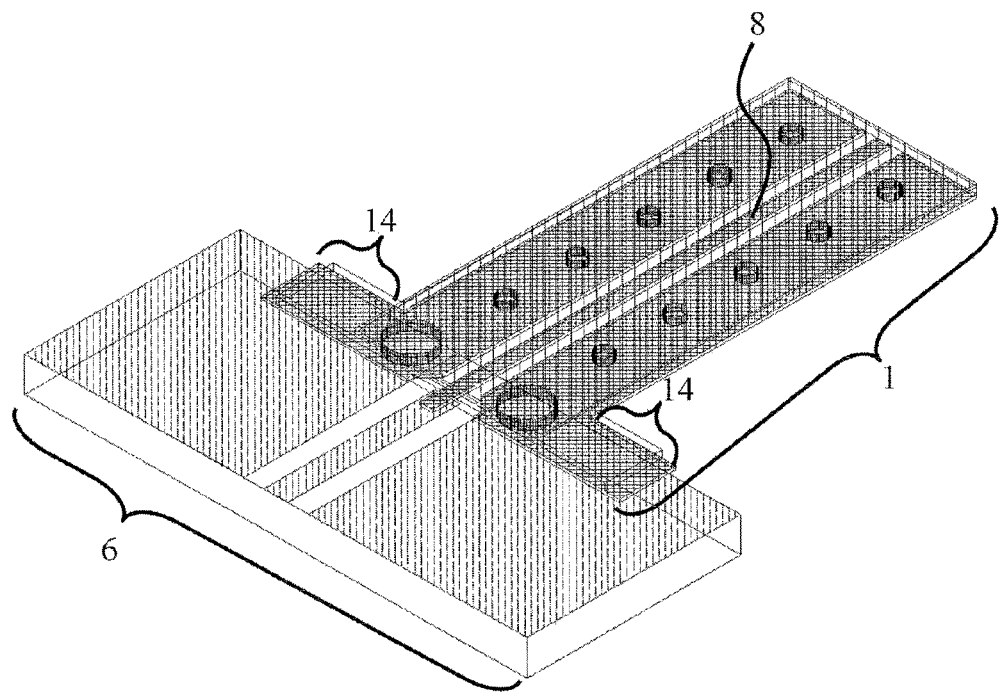
FIG. 7 is a perspective view of a fifth modification of the embodiment in FIG. 1.

FIG. 7 shows a fifth modification of the embodiment in FIG. 1. In FIG. 7, the difference of this modification from the embodiment in FIG. 1 lies in that the substrate 1 has a substrate expansion portion 14 formed by expanding the substrate 1 in the direction orthogonal to the direction in which the signal line 8 extends.

For the substrate expansion portion 14, it is essential only that at least the base material 3 is expanded. As required, the substrate surface grounds 2 and the substrate rear-surface grounds 5 can be expanded, as well. The substrate expansion portion 14 is fixed to the dielectric substrate 6 by an adhesive.

The expansion of the substrate 1 in the direction orthogonal to the direction of the signal line 8 as shown in FIG. 7, produces an effect similar to that of the modification in FIG. 6.

Moreover, the expansion of the substrate 1 in the direction orthogonal to the direction of the signal line 8 as shown in FIG. 7, eliminates the dielectric material (for example: flexible substrate) contacting the transmission line on the substrate 1, thereby reducing the influence of the transmission line on high frequency characteristic. In FIG. 7, because the structures other than the substrate expansion portion 14 is the same as those in FIG. 1, description thereof is omitted.

Figure 8:
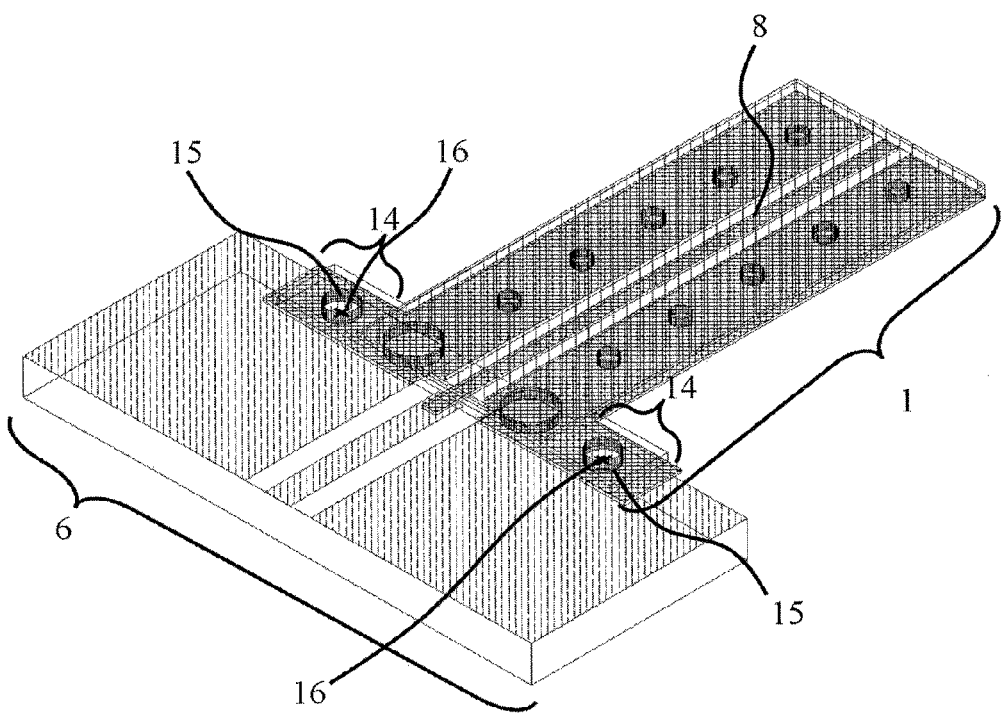
FIG. 8 is a perspective view of a further modification of the modification shown in FIG. 7.

FIG. 8 shows a further modification of the modification shown in FIG. 7. In FIG. 8, the difference of this modification from the modification in FIG. 7 lies in that through holes 15 penetrating the substrate expansion portion 14 are arranged.

As shown in FIG. 8, on the opposite sides of the substrate expansion portion 14, there are provided the through holes 15 formed by partially cutting out the base material 3, the substrate surface grounds 2, and the substrate rear-surface grounds 5. A plurality of the through holes 15 may be provided at each of the opposite sides of the substrate expansion portion 14.

The positions opposite to the through holes 15, on the dielectric substrate 6 are marked by markings 16 for alignment, and thereby it is possible to check the markings 16 on the dielectric substrate 6 through the through holes 15, and align the substrate connection positions.

In FIG. 8, because the structures other than the substrate expansion portion 14 are the same as those in FIG. 1, description thereof is omitted.

Figure 9:
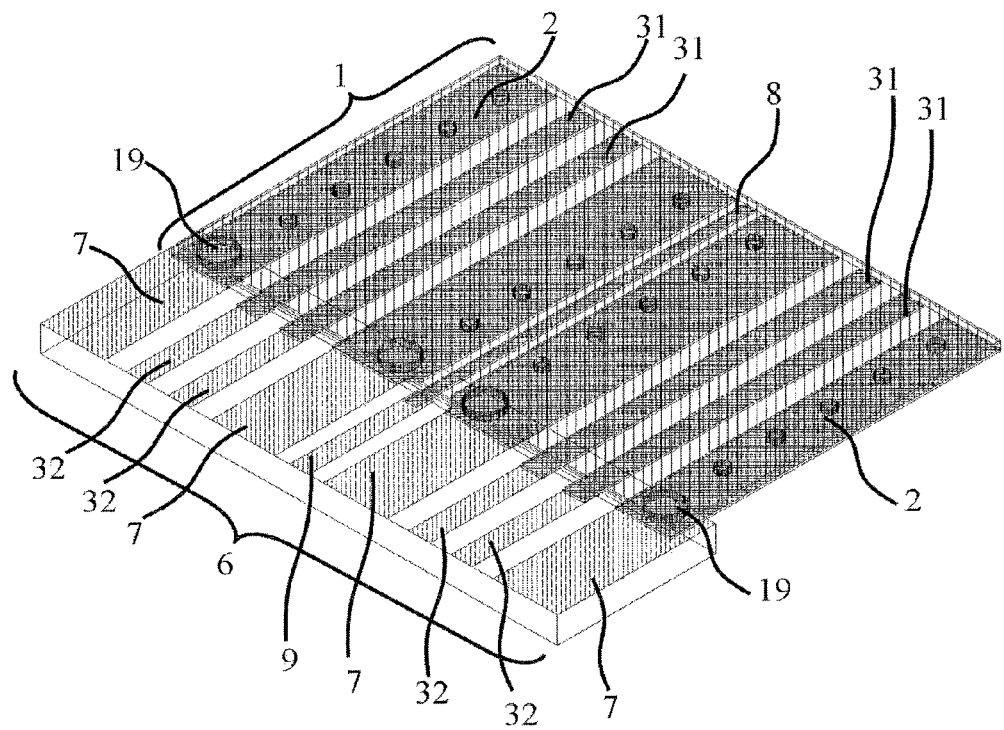
FIG. 9 is a perspective view of a sixth modification of the embodiment in FIG. 1.

FIG. 9 shows a sixth modification of the embodiment in FIG. 1. In FIG. 9, the difference of this modification from the embodiment in FIG. 1 lies in that wiring lines are newly provided on opposite outsides of the transmission line on each of the substrate 1 and the dielectric substrate 6.

On the substrate 1, the wiring lines 31 are arranged on the opposite outsides of the transmission line on the surface of the substrate 1, while wiring lines 32 are arranged on opposite outsides of the transmission line on the surface of the dielectric substrate 6.

On each of the opposite outsides of the wiring lines 31 on the substrate 1, a substrate surface ground 2 is further provided. Furthermore, in each of the substrate surface grounds 2 outside the wiring lines 31, a ground exposed portion 19 is provided. As in the case in FIG. 1, the substrate 1 is connected to the dielectric substrate 6 using these ground exposed portions 19.

The wiring lines 31 and 32 are ones capable of passing electric currents or supplying signals.

When attempting to connect a transmission line for transmitting high frequency signals and other lines in a collective manner, a use of the construction shown in FIG. 9 in a section where high frequency modulation signals are connected to TEC (thermoelectric cooler), LD (laser diode)/PD (photodiode) bias, or the like, such as transmitter optical sub-assembly (TOSA) or receiver optical sub-assembly (ROSA), enables wiring lines to be unified, thereby facilitating the assembly of a module.

In FIG. 9, because the structures other than the above-described wiring lines 31 and 32 and substrate surface grounds 2, each of which has been added, are the same as those in FIG. 1, description thereof is omitted.

Figure 10:
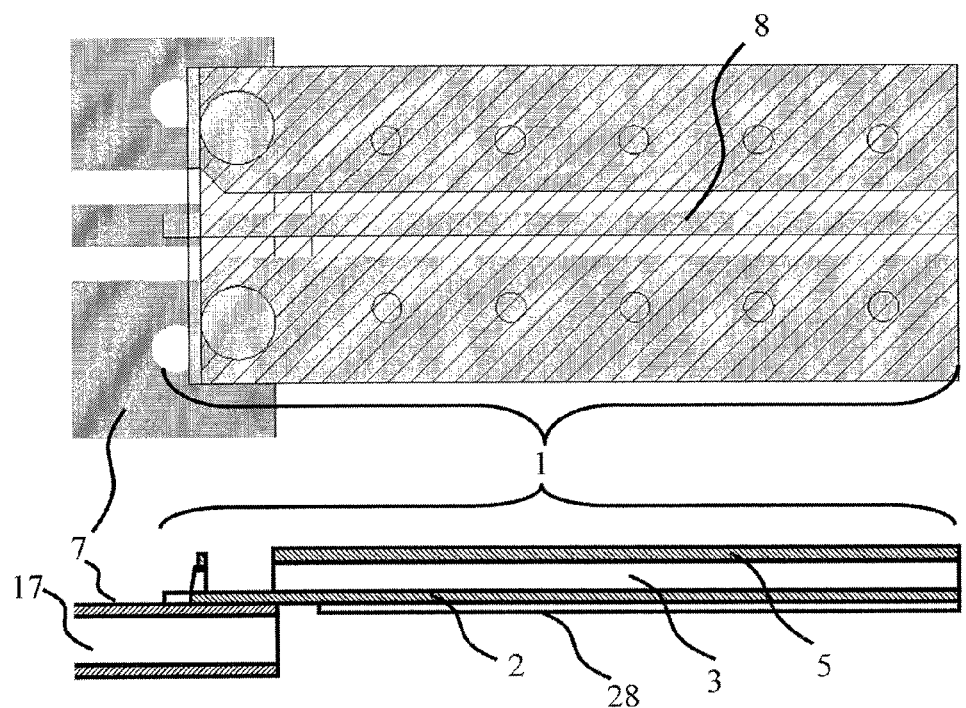
FIG. 10 is a representation of a seventh modification of the embodiment in FIG. 1.
Figure 11:
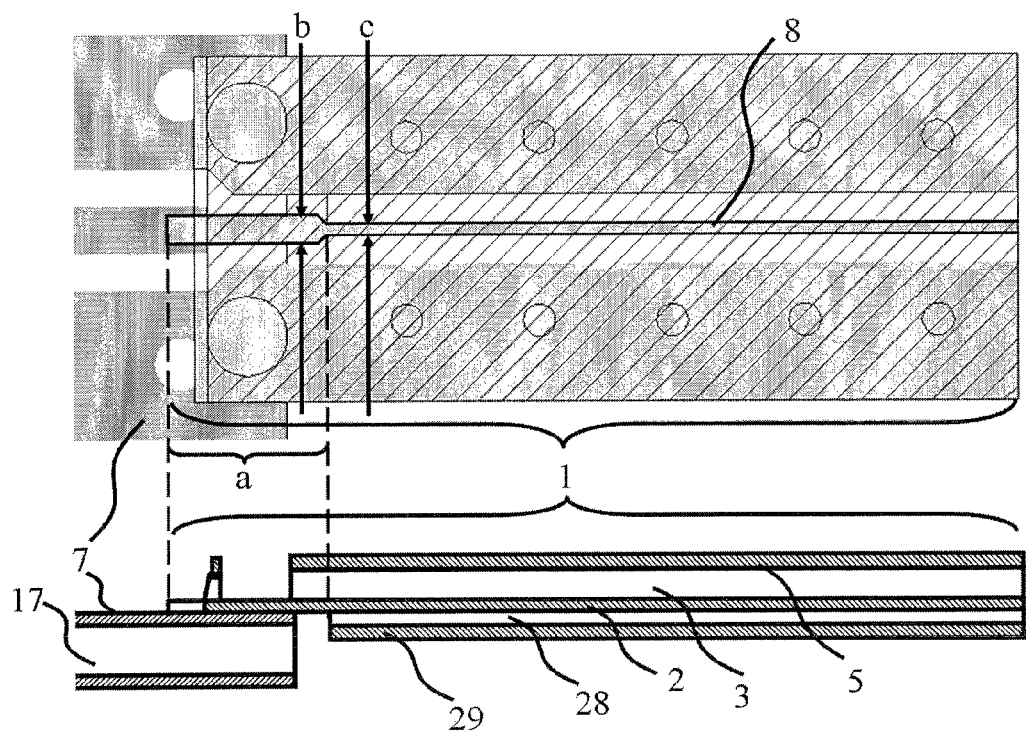
FIG. 11 is a representation of an eighth modification of the embodiment in FIG. 1.

FIGS. 10 and 11, respectively, show seventh and eighth modifications of the embodiment in FIG. 1. FIGS. 10 and 11 each illustrate examples of the arrangement in which a resist layer 28 is provided on the substrate 1, the arrangement having been mentioned in the above description of FIG. 1.

A resist layer 28 in FIG. 10 is arranged on the substrate surface (surface on which the signal line 8 is arranged). If the condition set forth in the description of FIG. 1 is satisfied, a flexible substrate (polyimide layer or the like) may be used instead of resist material. That is, anything that causes neither position tolerance nor level difference at the connection portion between the substrate 1 and the dielectric substrate 6 so as to exert no virtual influence on impedance may be provided on the substrate surface.

The modification in FIG. 11 is configured so that a ground layer 29 is arranged on the resist layer 28 or the flexible substrate.

Providing the ground layer 29 allows wiring to be formed into a strip line shape. When the ground layer 29 is provided, it is necessary that the impedance of the transmission line formed on the substrate 1 does not vary between the portion with the ground layer 29 and the portion without it.

For this purpose, when the width of the signal line 8 with the ground layer 29 is denoted by "c", and the width of the signal line 8 in a portion "a" without the ground layer 29 is denoted by "b", the width b is made larger than the width "c". The change in width of the signal line 8 is made by a change in a tapering manner.

In FIGS. 10 and 11, because the structures other than the resist layer 28 and the ground layer 29 that have been added, are the same as those in FIG. 1, description thereof is omitted.

Figure 12:
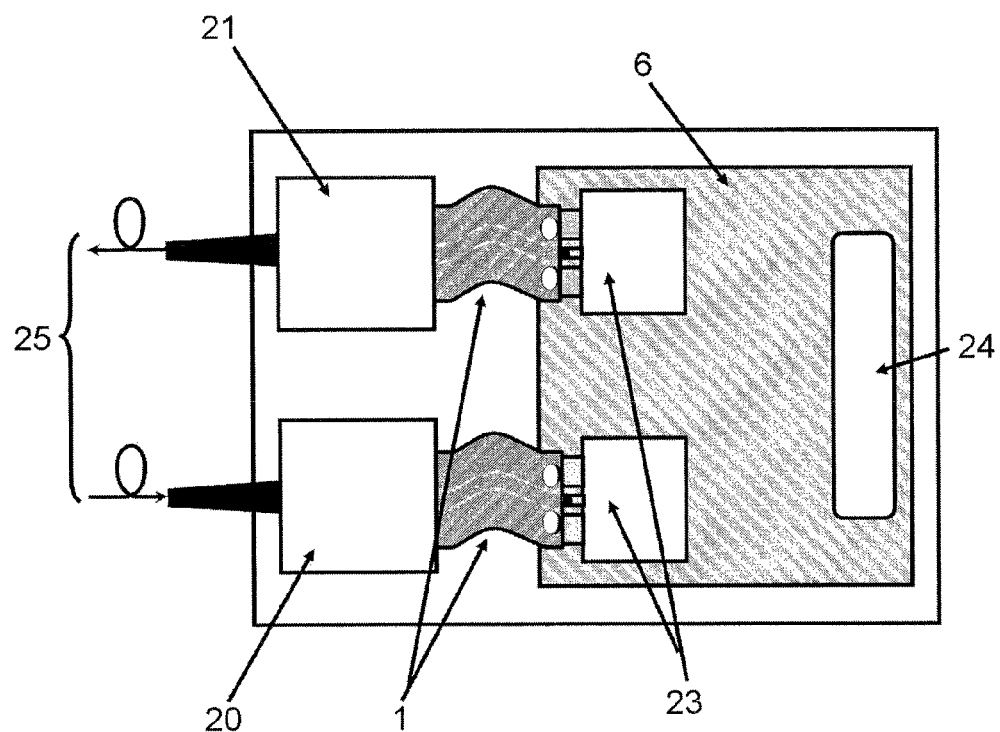
FIG. 12 is a block diagram of an optical transceiver module.
Figure 13:
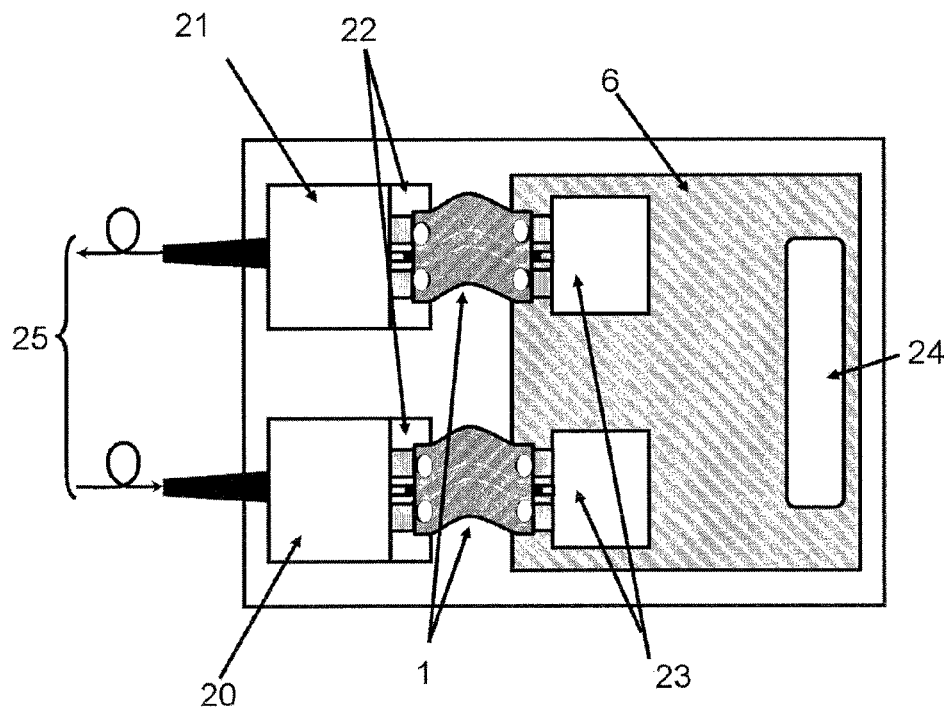
FIG. 13 is a block diagram of another optical transceiver module.

Any one of the connection configurations shown in FIGS. 1 to 10 is suitable for ones that have signal transmission lines with wide-bands and high-frequencies and that structurally require size reduction, such as an optical transceiver module. FIGS. 12 and 13 are each a representation of an optical transceiver module. FIGS. 12 and 13 each show an example in which any of the connection configurations in FIGS. 1 to 10 is incorporated into an optical transceiver module.

The optical transceiver module in FIG. 12 comprises optical interfaces 25, an electrical interface 24, an O/E module 20, an E/O module 21, substrates 1, a dielectric substrate 6, and amplifiers 23.

Here, the connection between the substrate 1 and the dielectric substrate 6 can be performed using any one of arrangements in FIGS. 1 to 11.

The dielectric substrate 6 includes an amplifier 23 for amplifying high frequency signals to be sent to the E/O module 21, and an amplifier 23 for amplifying high frequency signals from the O/E module 20.

The electrical interface 24 is a circuit for inputting signals from the outside into circuits inside the substrates 1, and outputting signals from inside the substrates 1 to the outside.

The optical transceiver module in FIG. 13 comprises optical interfaces 25, an electrical interface 24, an O/E module 20, an E/O module 21, substrates 1, a dielectric substrate 6, amplifiers 23, and ceramic terminals 22.

The difference of the optical transceiver module in FIG. 13 from that in FIG. 12 lies in that each of the O/E module 20 and the E/O module 21 has a ceramic terminal 22.

The ceramic terminal 22 has a construction similar to that of the connection portion of the dielectric substrate 6.

Figure 14:
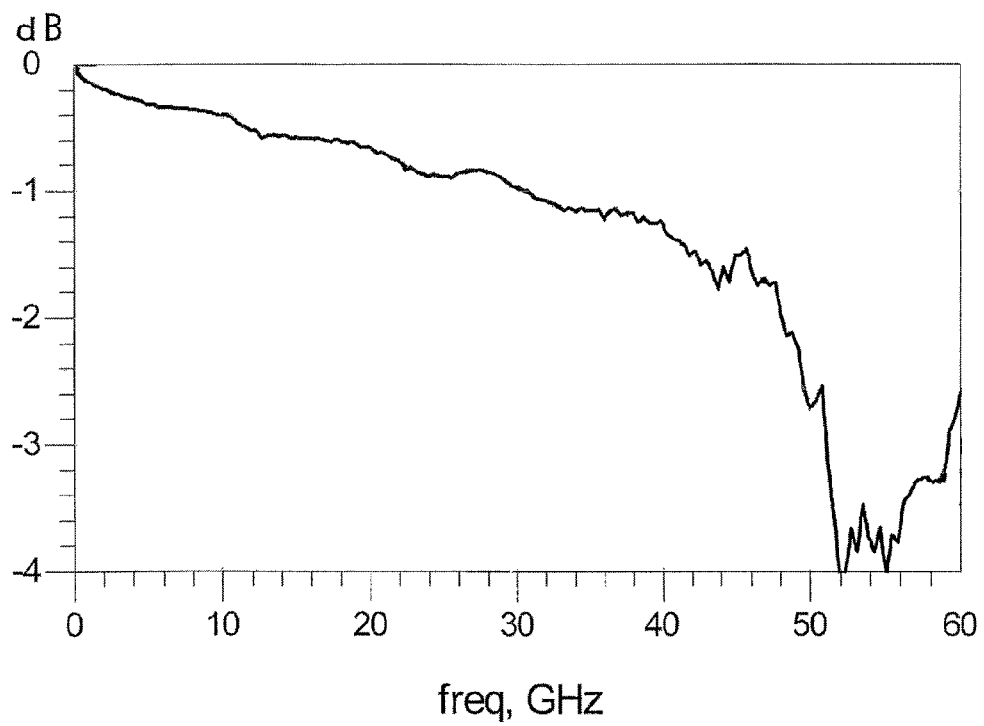
FIG. 14 is a graph showing a frequency characteristic of the optical transceiver module shown in FIG. 13.

FIG. 14 shows a frequency characteristic of the optical transceiver module in FIG. 13. The substrate 1 used in measurements of the above-described frequency characteristic has a size of 10 mm square.

It is to be understood that the above-described working examples of the present invention are illustrative and that the present invention is not limited to the working examples. If necessary, these working examples can be combined as appropriate.

In the present invention, the construction in FIG. 2 is combinable with any of those in FIGS. 3 to 11. The construction in FIG. 3 is combinable with any of those in FIG. 2 and FIGS. 4 to 11. The construction in FIG. 4 is combinable with any of those in FIGS. 2 and 3, and FIGS. 5 to 11. The construction in FIG. 5 is combinable with any of those in FIGS. 2 to 4, and FIGS. 6 to 11. The construction in FIG. 6 is combinable with any of those in FIGS. 2 to 5, and FIGS. 7 to 11. The construction in FIG. 7 is combinable with any of those in FIGS. 2 to 6, and FIGS. 8 to 11. The construction in FIG. 8 is combinable with any of those in FIGS. 2 to 7, and FIGS. 9 to 11. The construction in FIG. 9 is combinable with any of those in FIGS. 2 to 8, and FIGS. 10 and 11. The construction in FIG. 10 is combinable with any of those in FIGS. 2 to 9, and FIG. 11. The construction in FIG. 11 is combinable with any of those in FIGS. 2 to 10.

In the above-described combinations between the constructions, the combinations between the constructions regarding the substrates 1 can be applied to the optical transceiver modules in FIGS. 12 and 13.

Figure 15:
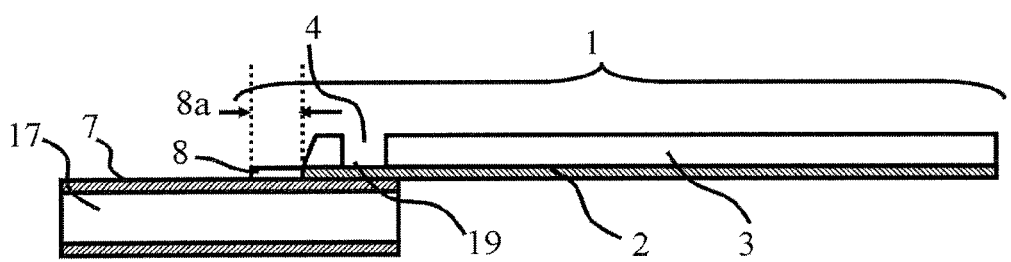
FIG. 15 is a sectional view of a ninth modification of the embodiment in FIG. 1.

FIG. 15 shows a ninth modification of the first embodiment in FIG. 1. Although each of the substrates in FIGS. 1 to 11 have been described as having the substrate rear-surface grounds 5, it may be a substrate without the substrate rear-surface grounds 5, as shown in FIG. 15. In this case, holes 4 are formed only in the base material 3 of the substrate 1, from the rear surface side of the substrate 1.

In FIG. 15, the connection between the substrate 1 and the dielectric substrate 6 can be performed using the same construction and connection method as those in FIG. 1. Furthermore, it is possible to apply the construction without the substrate rear-surface grounds 5, shown in FIG. 15, to any one of the substrates 1 and the dielectric substrates 6 in FIGS. 2 to 11.

In FIG. 15, because the structures other than the substrate rear-surface grounds 5 are the same as those in FIG. 1, description thereof is omitted.

What is claimed is:

1. A transmission line connector, comprising:
   a substrate;
   a transmission line positioned on a first side of the substrate, the transmission line including a signal line and at least two grounds, the signal line being positioned between the at least two grounds, the signal line including a connecting portion extending outside the substrate; and a side ground exposing portion, which is made by cutting out a portion of the substrate from a second side opposite to the first side up to the at least two grounds on the first side of the base material, at an edge portion of the substrate, so that the one of the at least two grounds is exposed from the second side, wherein the transmission line connector is put in contact with a similar transmission line connector by placing the connecting portion of the signal line on a signal line of the similar transmission connector, and having the at least two grounds of the transmission line connector in contact with grounds of the similar transmission connector at the first side ground exposing portion.

2. A substrate module, comprising:

a first substrate having a first substrate base material having a first substrate top face and a first substrate bottom face, which is opposite to the first substrate top face, a first substrate transmission line positioned on the top face of the first substrate base material, the first substrate transmission line including a first substrate signal line and first grounds, the first substrate signal line being positioned between the first grounds, and a ground exposed portion manufactured by cutting out a portion of the first substrate base material from the first substrate bottom face, the ground exposed portion exposing at least one of the first grounds from the bottom face side, the ground exposed portion being positioned at an end of the first substrate and lateral to the first substrate signal line; and a second substrate having a second substrate base material having a second substrate top face and a second substrate bottom face, which is opposite to the second substrate top face, the second substrate top face facing the first substrate top face, and a second substrate transmission line positioned on the second substrate top face of the second substrate base material, the second substrate transmission line including a second substrate signal line and second grounds, the second substrate signal line being positioned between the second grounds, and in contact with the first substrate signal line, each of the second grounds contacting each of the first grounds and being fixed at the ground exposed portion.

3. The substrate module of claim 2, wherein each of the second grounds is fixed to each of the first grounds by thermocompression.

4. The substrate module of claim 2, wherein the first substrate signal line includes a taper shape at a contact portion to the second substrate signal line.

5. The substrate module of claim 2, wherein the first ground includes a taper shape at a contact portion to the second ground.

6. The substrate module of claim 2, wherein the second substrate signal line has an end placing backward from an end of the second ground.

7. The substrate module of claim 2, wherein the second substrate is cut away at an end under the first substrate signal line.

8. The substrate module of claim 2, wherein the first substrate signal line has a project portion from an edge of the first substrate base material.

9. The substrate module of claim 2, wherein the first substrate signal line is connected to the second substrate signal line by a solder or an adhesive.

10. The substrate module of claim 2, wherein the second substrate base material includes a hole under the first substrate signal line.

11. The substrate module of claim 2 wherein the first substrate base material includes a first substrate line for providing a signal or power; and the second substrate base material includes a second substrate line for providing a signal or power.

12. The substrate module of claim 2, wherein each of the second grounds is fixed to each of the first grounds by a fixing material.

13. The substrate module of claim 12, wherein the fixing material is gold.

14. The substrate module of claim 12, wherein the fixing material is tin.

15. The substrate module of claim 12, wherein the fixing material is a solder.

16. A transmission line connector, comprising:

a flexible substrate;

a transmission line positioned on a first side of the substrate, the transmission line including a signal line and at least two grounds, the signal line being positioned between the at least two grounds, the signal line including a connecting portion extending outside the substrate, in the connecting portion at least one of the ground lines being exposed from a second side opposite to the first side, due to a removal of a portion of the substrate, wherein the transmission line connector is put in contact with a similar transmission line connector by placing the connecting portion of the signal line on a signal line of the similar transmission connector, and having the at least two grounds of the transmission line connector in contact from the second side with grounds of the similar transmission connector.

* * * * *